United States Patent
Kobayashi

(10) Patent No.: US 8,663,895 B2
(45) Date of Patent: Mar. 4, 2014

(54) METHOD FOR MANUFACTURING TEMPLATE AND METHOD FOR MANUFACTURING SEMICONDUCTOR DEVICE

(75) Inventor: Yoshihito Kobayashi, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 567 days.

(21) Appl. No.: 12/883,935

(22) Filed: Sep. 16, 2010

(65) Prior Publication Data

US 2011/0068083 A1    Mar. 24, 2011

(30) Foreign Application Priority Data

Sep. 18, 2009 (JP) ................. 2009-218107

(51) Int. Cl.
- *G03C 5/00* (2006.01)
- *G03F 7/00* (2006.01)
- *C03C 25/68* (2006.01)

(52) U.S. Cl.
USPC ........................................ 430/269; 216/54

(58) Field of Classification Search
USPC ............................................................ 216/54
See application file for complete search history.

(56) References Cited

U.S. PATENT DOCUMENTS

| | | | |
|---|---|---|---|
| 2001/0048145 A1* | 12/2001 | Takeuchi et al. | 257/620 |
| 2006/0144275 A1* | 7/2006 | Kolesnychenko et al. | 101/483 |
| 2007/0264591 A1* | 11/2007 | Wuister et al. | 430/269 |
| 2010/0022036 A1 | 1/2010 | Yoneda et al. | |
| 2010/0285167 A1* | 11/2010 | Sandhu et al. | 425/385 |

FOREIGN PATENT DOCUMENTS

JP    2008-270686    11/2008

\* cited by examiner

*Primary Examiner* — Binh X Tran
*Assistant Examiner* — Thomas Pham
(74) *Attorney, Agent, or Firm* — Finnegan, Henderson, Farabow, Garrett & Dunner, LLP

(57) ABSTRACT

According to one embodiment, a method for manufacturing a template for imprinting includes preparing a first template having a device pattern and a plurality of identification patterns, and forming a second template by transferring the device pattern and at lest desired one of the identification patterns to a template substrate.

7 Claims, 8 Drawing Sheets

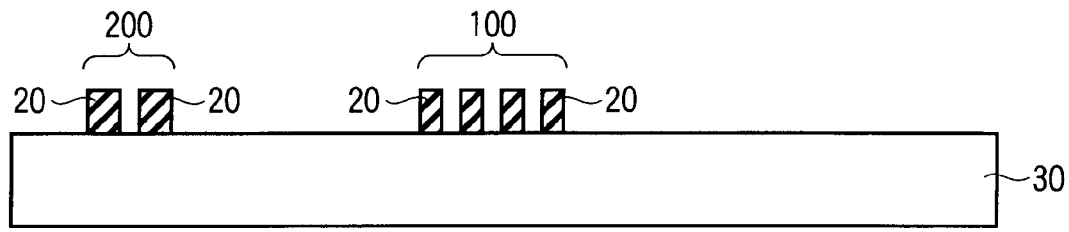
F I G. 4
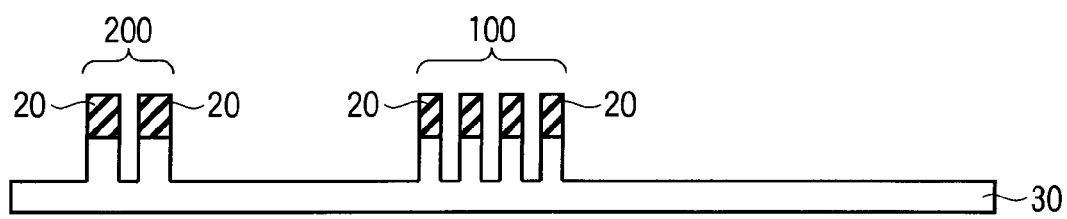
F I G. 5
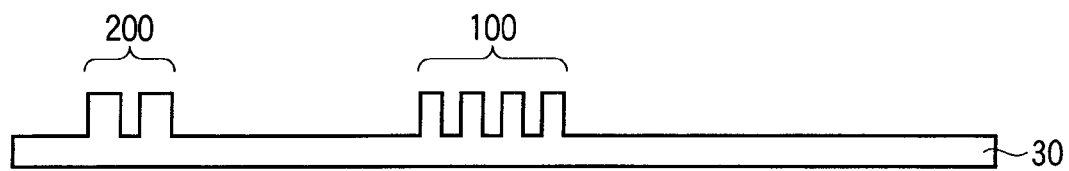
F I G. 6

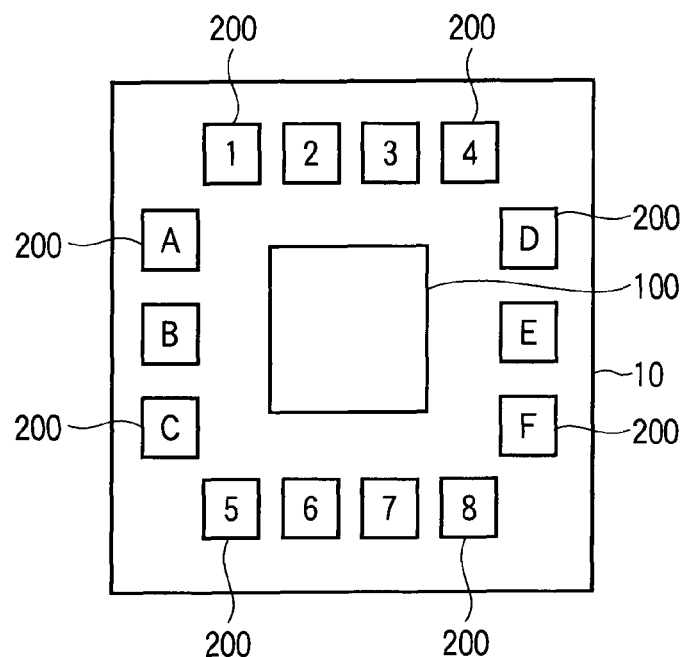
F I G. 7
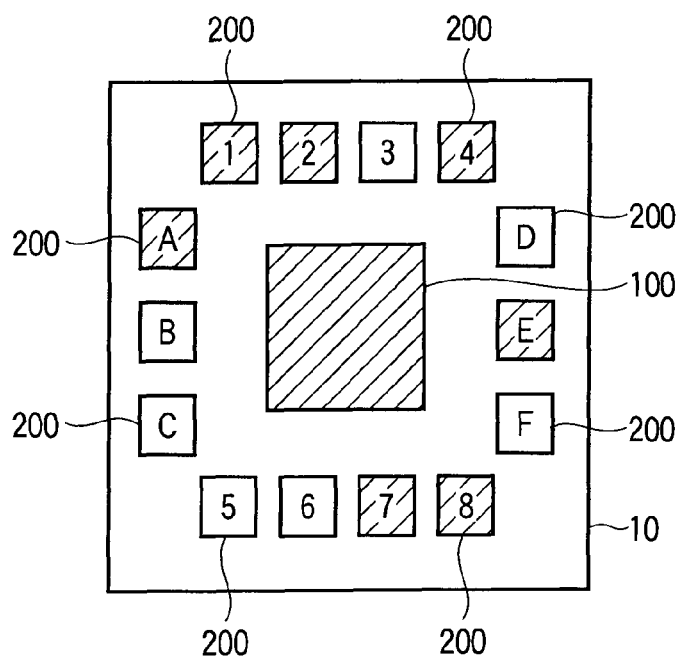
F I G. 8

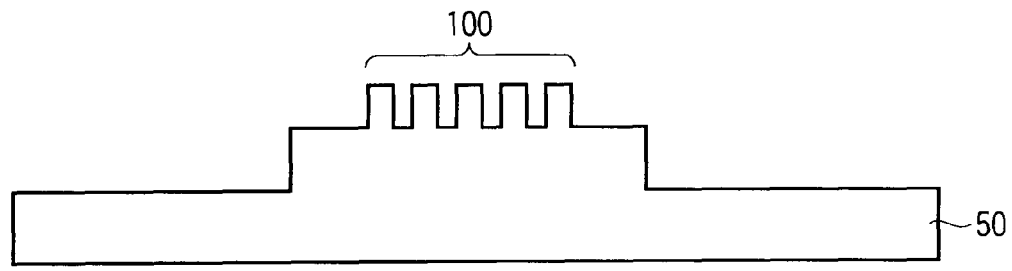
F I G. 11
F I G. 12
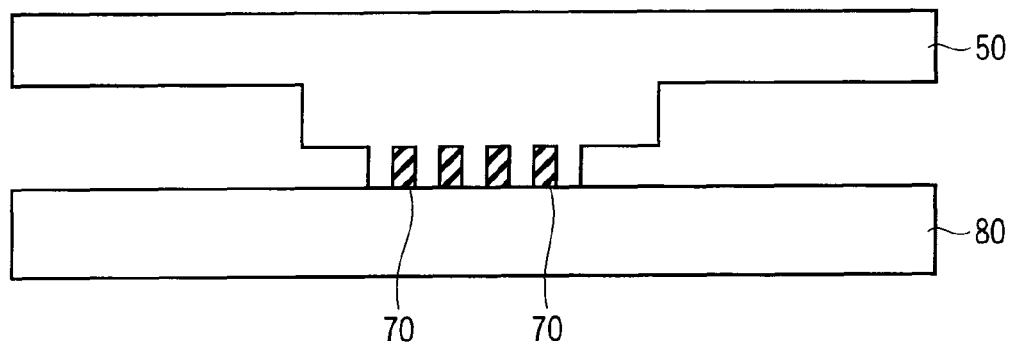
F I G. 13

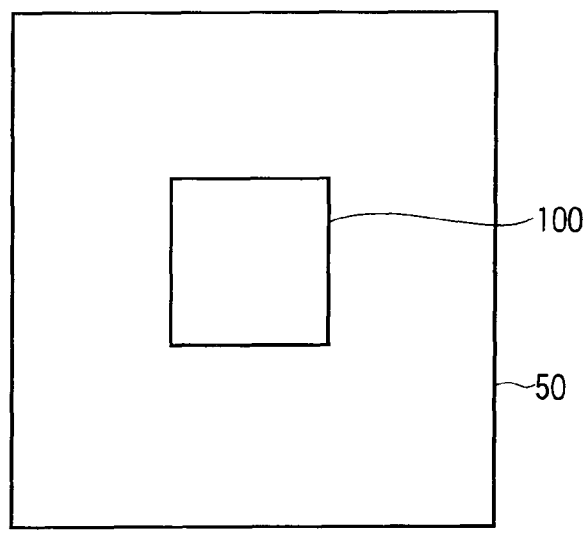
F I G. 17
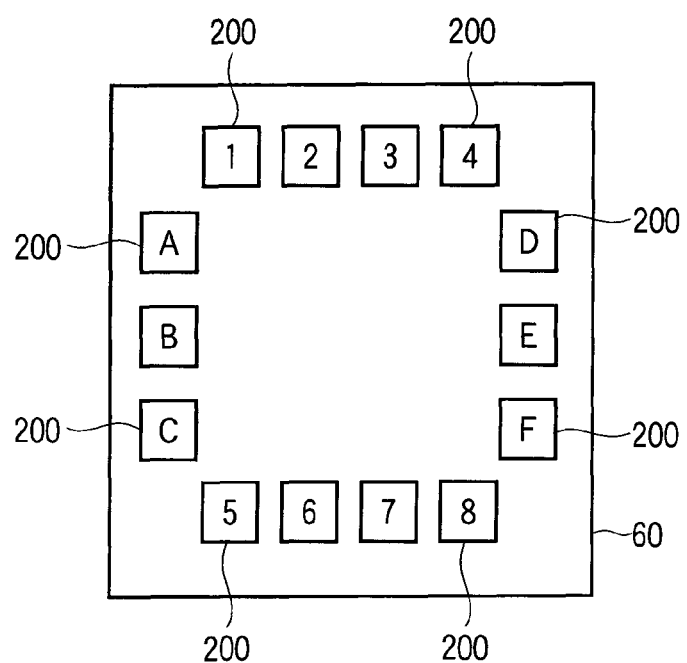
F I G. 18

METHOD FOR MANUFACTURING TEMPLATE AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2009-218107, filed Sep. 18, 2009; the entire contents of which are incorporated herein by reference.

FIELD

Embodiments described herein relate generally to a method for manufacturing a template and a method for manufacturing a semiconductor device.

BACKGROUND

Imprinting methods (nano-imprinting methods) have been proposed as lithographic technology for semiconductor devices (for example, see Jpn. Pat. Appln. KOKAI Publication No. 2008-270686). Templates used in the imprinting methods are commonly produced by electron beam lithography. Therefore, much time and a lot of costs are required commonly. Hence, a proposal has been made for producing plural child templates from a mother template by using imprinting technology.

However, a great number of same templates are produced and are difficult to manage and identify the templates individually.

BRIEF DESCRIPTION OF THE DRAWINGS

FIG. 4 is a cross-sectional view schematically illustrating a part of the method for manufacturing a template according to the first embodiment;

FIG. 5 is a cross-sectional view schematically illustrating a part of the method for manufacturing a template according to the first embodiment;

FIG. 6 is a cross-sectional view schematically illustrating a part of the method for manufacturing a template according to the first embodiment;

FIG. 7 is a plan view schematically illustrating a part of the method for manufacturing a template according to the first embodiment;

FIG. 8 is a plan view schematically illustrating a part of the method for manufacturing a template according to the first embodiment;

FIG. 11 is a cross-sectional view schematically illustrating a part of a method for manufacturing a template according to the second embodiment;

FIG. 12 is a cross-sectional view schematically illustrating a part of a method for manufacturing a template according to the second embodiment;

FIG. 13 is a cross-sectional view schematically illustrating a part of a method for manufacturing a template according to the second embodiment;

FIG. 17 is a plan view schematically illustrating a part of the method for manufacturing a template according to the second embodiment;

FIG. 18 is a plan view schematically illustrating a part of the method for manufacturing a template according to the second embodiment;

DETAILED DESCRIPTION

In general, according to one embodiment, there is provided a method for manufacturing a template for imprinting, the method comprising preparing a first template having a device pattern and a plurality of identification patterns, and forming a second template by transferring the device pattern and at lest desired one of the identification patterns to a template substrate.

Embodiment 1

FIG. 1, FIG. 2, FIG. 3, FIG. 4, FIG. 5, and FIG. 6 are cross-sectional views schematically illustrating a method for manufacturing a template according to the first embodiment. FIG. 7, FIG. 8, FIG. 9, and FIG. 10 are plan views schematically illustrating the method for manufacturing a template according to the first embodiment.

Figure 1:
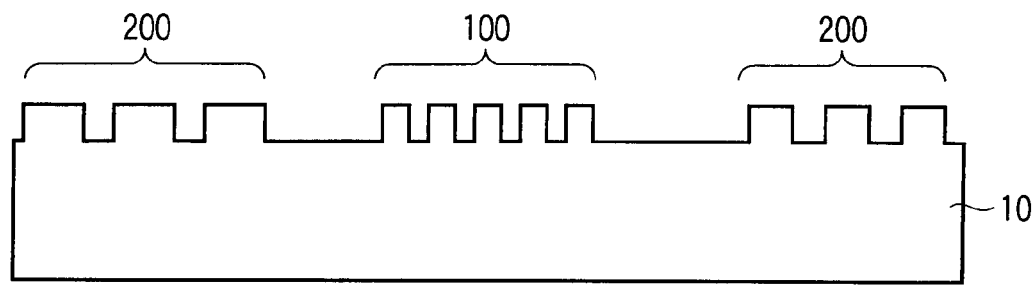
FIG. 1 is a cross-sectional view schematically illustrating a part of a method for manufacturing a template according to the first embodiment.

At first, as illustrated in FIG. 1, a mother template (first template) 10 is prepared. A device pattern area 100 and plural identification pattern areas 200 are provided in the mother template 10. As illustrated in FIG. 7, the identification pattern areas 200 are formed outside the device pattern area 100.

In the device pattern area 100, a pattern for forming a device pattern of a semiconductor device (semiconductor integrated circuit device) is formed. The device pattern comprises patterns for forming elements such as transistors, and patterns of wirings.

Patterns for forming identification patterns are formed in the identification pattern areas 200. The identification patterns are used to identify plural child templates manufactured in a later step. The plural child templates may be assigned with a combination of respectively different identification patterns, and the plural child templates can be thereby identified. For example, numerals, alphabets, bar codes, and figures can be used for the identification patterns.

Figure 2:
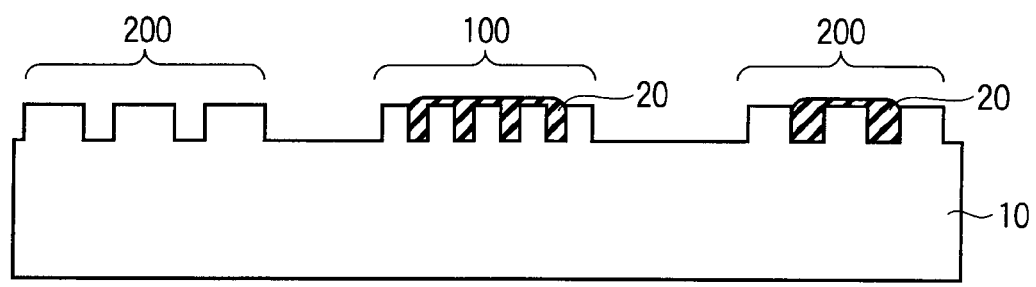
FIG. 2 is a cross-sectional view schematically illustrating a part of the method for manufacturing a template according to the first embodiment.

Next, as illustrated in FIG. 2, an imprinting agent (imprinting resist) 20 is supplied to a surface of the mother template 10 by an inkjet method. Specifically, the imprinting agent 20 is selectively supplied to the device pattern area 100 and at least one desired identification pattern area 200. In this example, as illustrated in FIG. 8, the imprinting agent 20 is selectively supplied to identification pattern areas 200 corresponding to patterns "1", "2", "4", "7", "8", "A" and "E".

Figure 3:
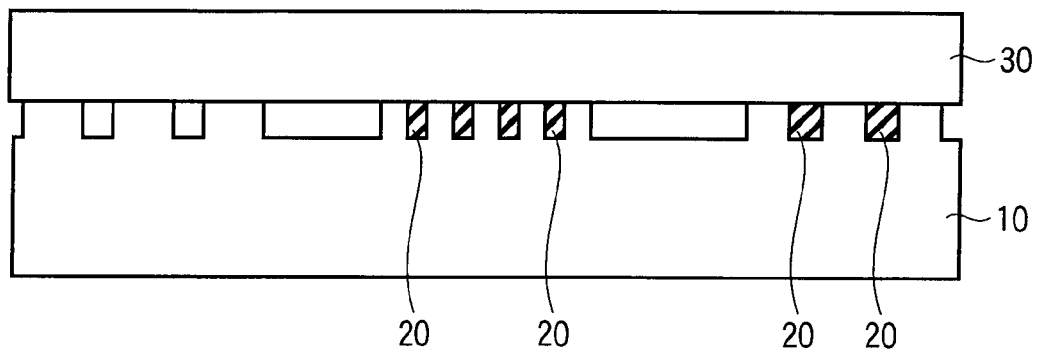
FIG. 3 is a cross-sectional view schematically illustrating a part of the method for manufacturing a template according to the first embodiment.

Next, as illustrated in FIG. 3, the mother template 10 is brought into contact with a template substrate for forming child templates (for example, a glass substrate made of quartz) 30. Further, the imprinting agent 20 is cured, interposed between the mother template 10 and the template substrate 30. In this manner, the patterns (device pattern and identification patterns) formed in the mother template 10 are transferred to the imprinting agent 20, thereby to form imprinting agent patterns.

The method for curing the imprinting agent 20 may employ photocuring (ultraviolet irradiation) or heat curing. A photocuring imprinting agent may be urethane-based resin, epoxy-based resin, or acryl-based resin. For exaample, HDDA (1,6-hexanediol-diacrylate) or HEBDM (bis(hydroxyethyl) bisphenol-A dimethacrylate) may be used. A heat curing imprinting agent may be phenol resin, epoxy resin, silicone, or polyimide. Alternatively, heat reversible resin such as polymethyl polymethacrylate (PMMA), polycarbonate (PC), or acryl may be used.

Figure 9:
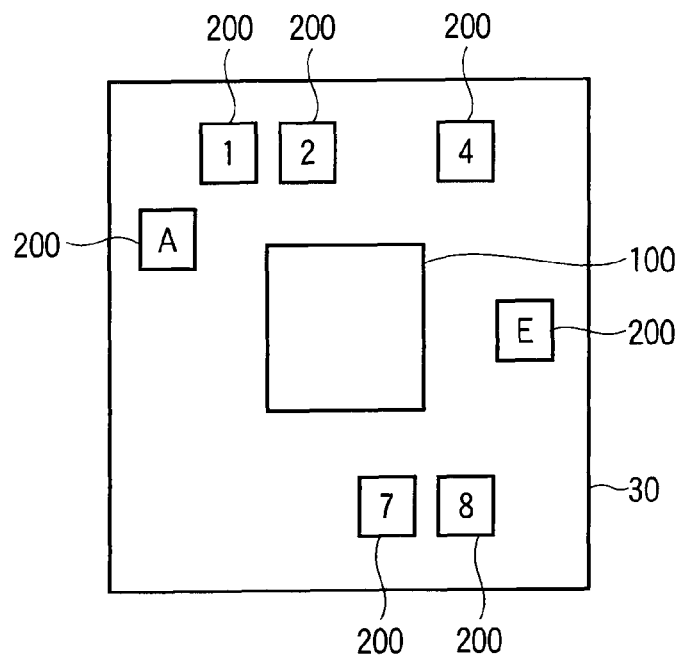
FIG. 9 is a plan view schematically illustrating a part of the method for manufacturing a template according to the first embodiment.

Next, as illustrated in FIG. 4, the mother template 10 is separated from the template substrate 30. At this time, the cured imprinting agent pattern 20 is formed on the template substrate 30. That is, as illustrated in FIG. 9, an imprinting agent pattern for forming a device pattern is formed in the device pattern area 100, and imprinting agent patterns for forming desired identification patterns are formed in the identification pattern areas 200.

Next, as illustrated in FIG. 5, the template substrate 30 is etched, using the imprinting agent patterns 20 as masks. For example, the etching may employ dry etching. In this manner, the template substrate 30 is etched to a predetermined depth.

Figure 10:
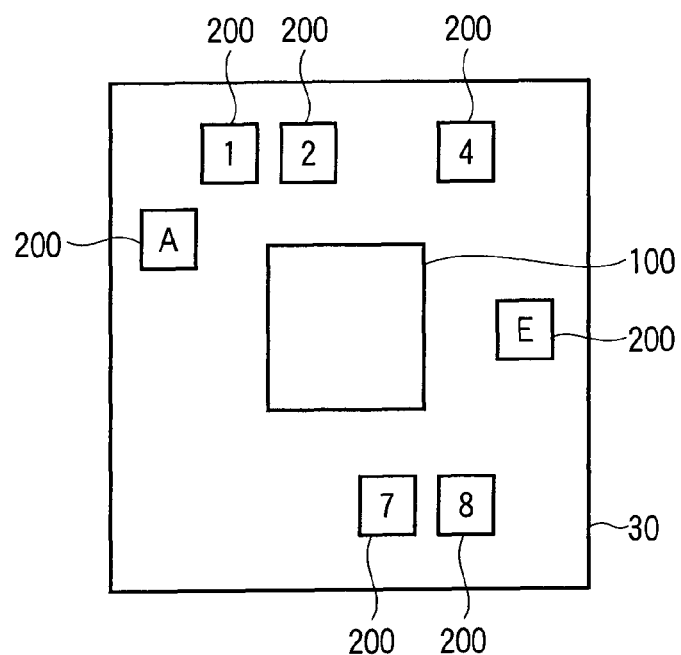
FIG. 10 is a plan view schematically illustrating a part of a method for manufacturing a template according to the first embodiment.

Next, as illustrated in FIG. 6, the imprinting agent patterns 20 are removed. A child template (second template) 30 as illustrated in FIG. 6 and FIG. 10 is thereby formed.

The foregoing steps illustrated in FIG. 1, FIG. 2, FIG. 3, FIG. 4, FIG. 5, and FIG. 6 are performed while changing the combination of the identification patterns. Accordingly, plural child templates which can be identified from each other can be manufactured. That is, plural child templates which have respectively different combinations of identification patterns can be manufactured.

As has been described above, according to the present embodiment, plural identification patterns are formed in advance in a mother template. When a child template is manufactured, a combination of desired identification patterns is selected, and the desired identification patterns are transferred to the child template. In this manner, plural child templates which have respectively different combinations of identification patterns can be manufactured. As a result, plural child templates can be steadily identified, and can be managed correctly. Further, plural child templates which can be identified from each other can be manufactured from one type of mother template. Therefore, manufacturing costs and time hardly increase. Further, since a device pattern and identification patterns can be simultaneously transferred, child templates can be efficiently manufactured without greatly increasing a number of manufacturing steps.

In the above embodiment, a combination of desired identification patterns is obtained by selectively supplying an imprinting agent to the desired identification pattern areas. Alternatively, however, a combination of desired identification patterns may be obtained by selective light irradiation or selective heating to selectively cure the imprinting agent. For example, other identification pattern areas than desired identification pattern areas may be masked so as not to be irradiated with light.

Embodiment 2

Figure 19:
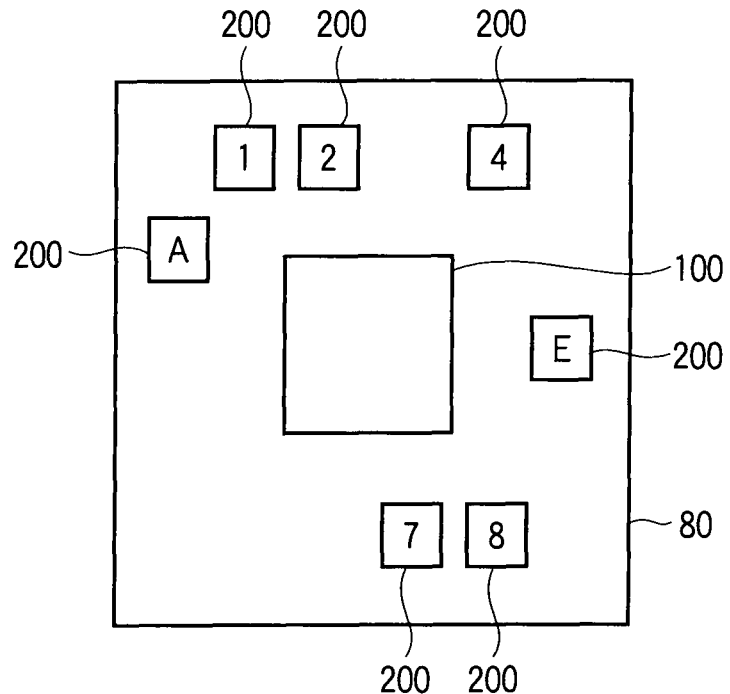
FIG. 19 is a plan view schematically illustrating a part of the method for manufacturing a template according to the second embodiment.

FIG. 11, FIG. 12, FIG. 13, FIG. 14, FIG. 15, and FIG. 16 are cross-sectional views schematically illustrating a method for manufacturing a template according to the second embodiment. FIG. 17, FIG. 18, and FIG. 19 are plan views schematically illustrating the method for manufacturing a template according to the second embodiment. The same matters as have been described in the first embodiment will be omitted from descriptions given below.

At first, as illustrated in FIG. 11 and FIG. 17, a mother template (first template) 50 is prepared. Further, an identification pattern template (second template) 60 as illustrated in FIG. 12 and FIG. 18 is prepared. A device pattern area 100 is provided in the mother template 50. Plural identification pattern areas 200 are provided in the identification pattern template 60.

In device pattern area 100, a pattern for forming a device pattern of a semiconductor device (semiconductor integrated circuit device) is formed. Patterns for forming identification patterns are formed in the identification pattern areas 200. Basic features of the device pattern and identification patterns are the same as those in the first embodiment. Therefore, descriptions thereof will be omitted herefrom.

Next, as illustrated in FIG. 13, an imprinting agent (imprinting resist) 70 is supplied to a surface of the mother template 10 by an inkjet method. Specifically, the imprinting agent 70 is selectively supplied to the device pattern area 100. Subsequently, the mother template 50 is brought into contact with a template substrate (for example, a glass substrate made of quartz) 80 for forming child templates. Further, the imprinting agent 70 is cured, interposed between the mother template 50 and the template substrate 80. In this manner, the pattern (device pattern) formed in the mother template 50 is transferred to the imprinting agent 70, thereby to form an imprinting agent pattern. Further, the mother template 50 is separated from the template substrate 80. At this time, the cured imprinting agent pattern 70 remains on the template substrate 80.

Figure 14:
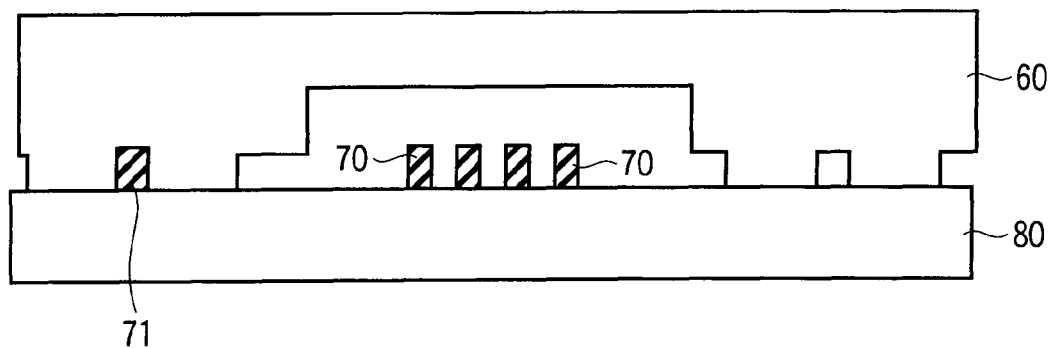
FIG. 14 is a cross-sectional view schematically illustrating a part of a method for manufacturing a template according to the second embodiment.

Next, as illustrated in FIG. 14, another imprinting agent (imprinting resist) 71 is supplied to a surface of the identification pattern template 60 by an inkjet method. Specifically, the imprinting agent 71 is selectively supplied to at least one desired identification pattern area 200. Subsequently, the identification pattern template 60 and the template substrate 80 are brought into contact with each other. Further, the imprinting agent 71 is cured, interposed between the identification pattern template 60 and the template substrate 80. In this manner, the pattern (desired identification pattern) formed in the identification pattern template 60 is transferred to the imprinting agent 71, thereby to form an imprinting agent pattern.

The device pattern area 100 and the identification pattern areas 200 are arranged in a positional relationship in which the device pattern and identification pattern transferred to the template substrate do not interfere with each other. Specifically, both the device pattern and the identification pattern are formed in projected portions of templates. Therefore, when the imprinting agent pattern 71 is formed in the step of FIG. 14, the imprinting agent pattern 70 which has already been formed is out of contact with the identification pattern template 60.

Figure 15:
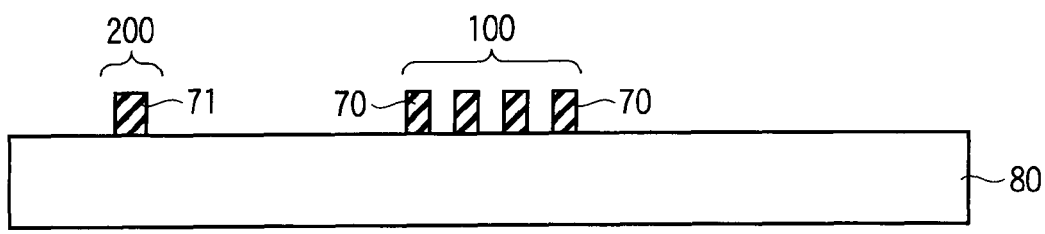
FIG. 15 is a cross-sectional view schematically illustrating a part of a method for manufacturing a template according to the second embodiment.

Further, the identification pattern template 60 is separated from the template substrate 80. At this time, the cured imprinting agent pattern 71 remains on the template substrate 30. In this manner, as illustrated in FIG. 15, a structure is obtained in which the imprinting agent patterns 70 and 71 are formed on the template substrate 80. That is, the imprinting agent pattern 70 for forming a device pattern is formed in the device pattern area 100, and the imprinting agent pattern 71 for forming a desired identification pattern is formed in an identification pattern area 200.

Figure 16:
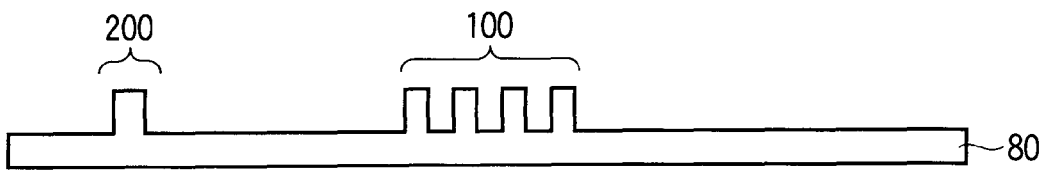
FIG. 16 is a cross-sectional view schematically illustrating a part of a method for manufacturing a template according to the second embodiment.

Next, the template substrate 80 is etched, using the imprinting agent patterns 70 and 71 as masks. In this manner, the template substrate 80 is etched to a predetermined depth. Further, the imprinting agent patterns 20 are removed. In this manner, a child template (third template) 80 as illustrated in FIG. 16 and FIG. 19 is formed.

The foregoing steps in FIG. 11, FIG. 12, FIG. 13, FIG. 14, FIG. 15, and FIG. 16 are performed while changing the combination of identification patterns. Accordingly, plural child templates which can be identified from each other can be manufactured.

As has been described above, according to the present embodiment, plural child templates which have respectively different combinations of identification patterns can be manufactured, as in the first embodiment. As a result, plural child templates can be steadily identified, and can be managed correctly. Further, plural child templates which can be identified from each other can be manufactured from one type of mother template and one type of identification pattern template. Therefore, manufacturing costs and time hardly increase.

In the above embodiment, a combination of desired identification patterns is obtained by selectively supplying an imprinting agent to the desired identification pattern areas. Alternatively, however, a combination of desired identification patterns may be obtained by selective light irradiation or selective heating to selectively cure the imprinting agent. For example, other identification pattern areas than desired identification pattern areas may be masked so as not to be irradiated with light.

Figure 20:
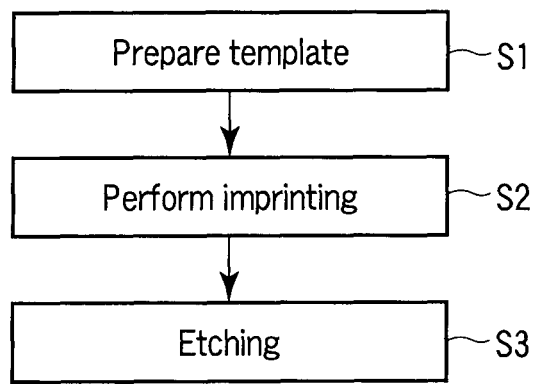
FIG. 20 is a flowchart schematically representing a method for manufacturing a semiconductor device according to the embodiments.

The first and second embodiments have been described above. A semiconductor device can be manufactured by using a child template obtained by any of the methods according to the first and second embodiments. FIG. 20 is a flowchart schematically representing a method for manufacturing a semiconductor device.

At first, a child template is manufactured according to the first or second embodiment (S1). Next, imprinting is performed by using the child template. That is, patterns in the child template are transferred to an imprinting agent (imprinting resist), and a resist pattern is formed on a semiconductor wafer (S2). Further, a desired pattern is formed by etching conductive films or insulating films on the semiconductor wafer, with the resist pattern used as a mask (S3).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing templates for imprinting, the method comprising:
preparing a first template having a device pattern and a plurality of identification patterns, the identification patterns being different from each other, and forming a plurality of second templates, each of the second templates being formed by simultaneously transferring the device pattern and selecting and transferring at least a desired one of the identification patterns capable of identifying the second templates on the first template to a template substrate,
wherein said at least desired one of the identification patterns of one of the second templates is different from that of another one of the second templates.

2. The method of claim 1, wherein
forming each of the second templates includes:
forming an imprinting agent pattern by transferring the device pattern and said at least desired one of the identification patterns to an imprinting agent interposed between the first template and the template substrate; and
etching the template substrate by using the imprinting agent pattern as a mask.

3. The method of claim 2, wherein
forming the imprinting agent pattern includes:
selectively supplying the imprinting agent to an area where the device pattern is formed and an area where said at least desired one of the identification patterns is formed; and
curing the selectively supplied imprinting agent, with the imprinting agent interposed between the first template and the template substrate.

4. The method of claim 2, wherein
the imprinting agent is supplied by an inkjet method.

5. The method of claim 1, wherein
the plurality of identification patterns are formed in an area outside an area where the device pattern is formed.

6. The method of claim 1, wherein
the device pattern includes a pattern for forming a semiconductor device.

7. A method for manufacturing a semiconductor device, the method comprising:
transferring a pattern formed in a template manufactured by the method of claim 1 to a semiconductor substrate.

* * * * *

UNITED STATES PATENT AND TRADEMARK OFFICE
CERTIFICATE OF CORRECTION

| | | |
|---|---|---|
| PATENT NO. | : 8,663,895 B2 | Page 1 of 1 |
| APPLICATION NO. | : 12/883935 | |
| DATED | : March 4, 2014 | |
| INVENTOR(S) | : Kobayashi | |

It is certified that error appears in the above-identified patent and that said Letters Patent is hereby corrected as shown below:

Title page, item (57), line 5, change "a lest desired one" to --at least a desired one--.

Signed and Sealed this
Tenth Day of June, 2014

Michelle K. Lee
*Deputy Director of the United States Patent and Trademark Office*